(12) United States Patent
Yamasaki

(10) Patent No.: US 9,692,350 B2
(45) Date of Patent: Jun. 27, 2017

(54) ELECTRICAL ROTATING MACHINE CONTROLLER

(71) Applicant: DENSO CORPORATION, Kariya, Aichi-pref. (JP)

(72) Inventor: Masashi Yamasaki, Obu (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/867,266

(22) Filed: Sep. 28, 2015

(65) Prior Publication Data

US 2016/0094175 A1    Mar. 31, 2016

(30) Foreign Application Priority Data

Sep. 30, 2014  (JP) ................................. 2014-200416

(51) Int. Cl.
*H02P 29/68* (2016.01)
*H01L 23/367* (2006.01)
(Continued)

(52) U.S. Cl.
CPC ............ *H02P 29/68* (2016.02); *B60L 15/007* (2013.01); *B62D 5/0406* (2013.01);
(Continued)

(58) Field of Classification Search
CPC .......... H02P 29/68; H02K 11/33; H02K 9/22; H02K 11/02; H02K 2203/03; B60L 15/007; B60L 2220/54; B60L 2240/421; B60L 2240/526; B60L 2240/525; B62D 5/0406; H01L 23/367; H01L 29/24; B62L 2220/54; Y02T 10/641; Y02T 10/645
(Continued)

(56) References Cited

U.S. PATENT DOCUMENTS 4,840,222 A * 6/1989 Lakin ..................... H02K 11/33
                                                     165/185
5,619,108 A * 4/1997 Komurasaki ........... H02J 7/248
                                                     310/68 R
(Continued)

OTHER PUBLICATIONS

U.S. Appl. No. 14/812,415, filed Jul. 29, 2015, Yamasaki, et al.
U.S. Appl. No. 14/812,757, filed Jul. 29, 2015, Yamasaki, et al.

*Primary Examiner* — Rita Leykin
(74) *Attorney, Agent, or Firm* — Knobbe, Martens, Olson & Bear, LLP

(57) ABSTRACT

An ECU, which acts as a "electrical rotating machine controller", controls driving of a motor unit having two winding sets. In the ECU, components having different heat dissipation properties are used as switching elements between two systems of inverters (electric power conversion circuit). For example, "component X" is used as switching elements of a first inverter acting as a "normal circuit", and "component Y" which has superior heat conductivity is used as switching elements, different from the switching elements of the first inverter, of a second inverter acting as a "particular circuit". As a result, the switching element (component Y) of the second inverter is more likely to have a longer lifespan than the switching element (component X) of the first inverter. Accordingly, the likelihood of both systems failing at the same time may be reduced.

7 Claims, 8 Drawing Sheets

(51) Int. Cl.
    *H02K 11/33*      (2016.01)
    *B62D 5/04*      (2006.01)
    *B60L 15/00*      (2006.01)
    *H02K 9/22*      (2006.01)
    *H02K 11/02*      (2016.01)

(52) U.S. Cl.
    CPC ............ *H01L 23/367* (2013.01); *H02K 11/33* (2016.01); *B60L 2220/54* (2013.01); *B60L 2240/421* (2013.01); *B60L 2240/525* (2013.01); *B60L 2240/526* (2013.01); *H01L 2924/0002* (2013.01); *H02K 9/22* (2013.01); *H02K 11/02* (2013.01); *H02K 2203/03* (2013.01); *Y02T 10/641* (2013.01); *Y02T 10/645* (2013.01)

(58) Field of Classification Search
    USPC ..... 257/718, 720, 276, 706, 717; 361/274.3, 361/679.47; 318/724
    See application file for complete search history.

(56) References Cited

U.S. PATENT DOCUMENTS

| | | | | |
|---|---|---|---|---|
| 5,632,351 | A * | 5/1997 | Ishiyama | B60K 1/00 180/65.1 |
| 6,721,181 | B1 * | 4/2004 | Pfeifer | H02M 7/003 165/80.4 |
| 6,940,164 | B1 * | 9/2005 | Yoshimatsu | H01L 23/13 257/532 |
| 7,358,699 | B2 * | 4/2008 | Kikuchi | H02K 5/22 310/113 |
| 7,414,339 | B2 * | 8/2008 | Kitamura | H02K 9/06 310/58 |
| 7,439,697 | B2 * | 10/2008 | Miyazaki | B60L 11/123 310/112 |
| 7,479,718 | B2 * | 1/2009 | Kikuchi | H02K 11/046 310/68 D |
| 7,729,148 | B2 * | 6/2010 | Hyvarinen | H02M 1/32 361/93.8 |
| 7,768,121 | B2 * | 8/2010 | Colgan | H01L 23/367 257/675 |
| 7,785,706 | B2 * | 8/2010 | Schroeder | H01L 21/02381 117/3 |
| 7,928,725 | B2 * | 4/2011 | Takahashi | G01D 3/036 324/207.25 |
| 8,028,531 | B2 * | 10/2011 | Phan | H01L 23/34 62/259.2 |
| 8,064,198 | B2 * | 11/2011 | Higashidani | H05K 7/20927 165/104.19 |
| 8,169,780 | B2 * | 5/2012 | Yoshino | H05K 7/20927 165/104.33 |
| 8,268,076 | B2 * | 9/2012 | Schroeder | H01L 21/02381 117/101 |
| 8,415,565 | B2 * | 4/2013 | Nagase | H05K 1/021 174/252 |
| 8,415,845 | B2 * | 4/2013 | Miyachi | B62D 5/0406 310/68 D |
| 8,471,417 | B2 * | 6/2013 | Fujita | H01L 24/40 310/43 |
| 8,471,418 | B2 * | 6/2013 | Yamasaki | B62D 5/0406 310/68 R |
| 8,546,925 | B2 * | 10/2013 | Herbsommer | H02M 3/1588 257/678 |
| 8,564,161 | B1 * | 10/2013 | Yamasaki | B62D 5/0406 310/64 |
| 8,564,996 | B2 * | 10/2013 | Masuzawa | H01L 25/072 363/131 |
| 8,659,194 | B2 * | 2/2014 | Motoda | H02K 11/33 310/64 |
| 8,760,872 | B2 * | 6/2014 | Herbsommer | H02M 3/00 361/704 |
| 8,805,602 | B2 * | 8/2014 | Yun | H05K 7/20872 180/65.31 |
| 8,847,454 | B2 * | 9/2014 | Saito | H02K 1/276 310/156.53 |
| 8,958,215 | B2 * | 2/2015 | Hirai | H01L 23/642 174/258 |
| 8,981,706 | B2 * | 3/2015 | Uryu | H02K 11/001 318/114 |
| 9,012,786 | B2 * | 4/2015 | Yano | H05K 1/0306 174/252 |
| 9,172,317 | B2 * | 10/2015 | Ishida | H02P 25/22 |
| 9,338,925 | B2 * | 5/2016 | Nakano | B62D 5/0406 |
| 9,397,592 | B2 * | 7/2016 | Kezobo | B62D 5/0484 |
| 9,496,773 | B2 * | 11/2016 | Ishigami | H02K 15/0081 |
| 9,564,779 | B2 * | 2/2017 | Nakano | H02K 21/16 |
| 2003/0015928 | A1 * | 1/2003 | Asao | H01L 25/115 310/68 D |
| 2003/0127921 | A1 * | 7/2003 | Akutsu | B62D 5/0406 310/68 R |
| 2004/0124726 | A1 * | 7/2004 | Hans | H02K 11/33 310/71 |
| 2005/0121986 | A1 * | 6/2005 | Matsuki | H05K 1/0203 310/64 |
| 2006/0087181 | A1 * | 4/2006 | Kusumi | H02J 7/248 310/68 D |
| 2006/0152095 | A1 * | 7/2006 | Kikuchi | H02K 11/048 310/68 R |
| 2006/0158049 | A1 * | 7/2006 | Suzuki | H02K 11/33 310/52 |
| 2006/0181162 | A1 * | 8/2006 | Pierret | H02K 11/048 310/58 |
| 2006/0202573 | A1 * | 9/2006 | Uehara | H02K 11/048 310/64 |
| 2009/0288425 | A1 * | 11/2009 | Phan | H01L 23/34 62/3.3 |
| 2010/0195286 | A1 * | 8/2010 | Dhawan | H05K 7/209 361/717 |
| 2010/0221869 | A1 * | 9/2010 | Schroeder | H01L 21/02381 438/104 |
| 2010/0288577 | A1 * | 11/2010 | Sonoda | B62D 5/0406 180/446 |
| 2011/0254388 | A1 * | 10/2011 | Yamasaki | B62D 5/0406 310/43 |
| 2013/0127037 | A1 * | 5/2013 | Mori | H01L 23/3677 257/712 |
| 2013/0285513 | A1 * | 10/2013 | Tani | H02K 11/0073 310/68 D |
| 2014/0111066 | A1 * | 4/2014 | Ito | H02K 3/12 310/68 D |
| 2014/0124915 | A1 * | 5/2014 | Hayashi | H01L 24/49 257/713 |
| 2014/0133202 | A1 * | 5/2014 | Tamaoka | H02M 1/4225 363/74 |
| 2014/0191628 | A1 * | 7/2014 | Nakano | H02K 1/2746 310/68 B |
| 2014/0265745 | A1 * | 9/2014 | Maki-Ontto | H02K 1/141 310/68 D |
| 2014/0361646 | A1 * | 12/2014 | Saito | H02K 3/28 310/51 |
| 2015/0188479 | A1 * | 7/2015 | Asai | H02P 9/48 318/400.13 |
| 2015/0357892 | A1 * | 12/2015 | Nakano | H02K 29/03 180/443 |
| 2016/0118923 | A1 * | 4/2016 | Kano | H02P 25/22 318/400.02 |
| 2016/0156253 | A1 * | 6/2016 | Owen | H02K 9/19 310/68 B |
| 2016/0294235 | A1 * | 10/2016 | Takizawa | H02K 21/14 |

\* cited by examiner

ELECTRICAL ROTATING MACHINE CONTROLLER

CROSS REFERENCE TO RELATED APPLICATION

The present application is based on Japanese Patent Application No. 2014-200416 filed on Sep. 30, 2014, disclosure of which is incorporated herein by reference.

TECHNICAL FIELD

The present disclosure relates to an electrical rotating machine controller that controls energizing of an electrical rotating machine.

BACKGROUND

Conventionally, a controller, which includes a plurality of systems of electric power conversion circuits arranged in parallel with each other with respect to a power source, is known. For example, JP 2011-229228 A discloses an electric device including two systems of electric power conversion circuits, where the physical build of a heat sink and the like may be easily modified for electric motors with different outputs.

SUMMARY

Incidentally, in an electrical rotating machine controller having multiple systems of electric power conversion circuits based on redundant design, the electronic components used to configure each system are generally of the same design, such that the output of each system of electric power conversion circuit is equal. Specifically, components having the same part numbers from the same manufacturers are used for all systems. Furthermore, when the components are controlled by manufacturing lots, components from the same lot are used if possible.

By strictly using electronic components having the same design between each system in this manner, degradation due to heat generation advances at the same rate. As a result, it is possible that the electronic components reach end-of-life all at once, and thus multiple systems fail at the same time. If such a situation occurs, one goal of redundant design, which is "when one system fails, allow operation to continue with other systems", is not achieved. However, JP 2011-229228 A does not make any reference to the possibility of two systems of electric power conversion circuits failing at the same time.

An object of the present disclosure is, in view of such a point, to provide an electrical rotating machine controller that reduces the likelihood of multiple systems of electric power conversion circuits failing at the same time.

According to the present disclosure, an electrical rotating machine controller controls energizing of an electrical rotating machine having a plurality of winding sets, and includes a plurality of systems of electric power conversion circuits and a heat sink.

The plurality of systems of electric power conversion circuits correspond to the plurality of winding sets, and convert and output electric power from a direct current source according to a switching operation of a plurality of switching elements in a bridge connection.

The heat sink receives heat generated by energizing of the plurality of switching elements.

A particular electric power conversion circuit of the plurality of systems of electric power conversion circuits is a "particular circuit", and an other electric power conversion circuit of the plurality of systems of electric power conversion circuits is a "normal circuit". A heat dissipation configuration from the plurality of switching elements to the heat sink of the "particular circuit" is different as compared to the "normal circuit", such that when the "particular circuit" and the "normal circuit" are under a same energizing condition, a temperature rise of the plurality of switching elements of the "particular circuit" is suppressed as compared to the "normal circuit", and the "particular circuit" and the "normal circuit", when under the same energizing condition, output a same amount of electric power According to the present disclosure, among the plurality of systems of electric power conversion circuits, a "particular circuit" having a relatively long lifespan is intentionally differentiated from an other "normal circuit". Further, a heat dissipation configuration from the plurality of switching elements to the heat sink in the particular circuit is different as compared to the normal circuit, such that when the particular circuit and the normal circuit are under a same energizing condition, a temperature rise of the plurality of switching elements of the particular circuit is suppressed as compared to the normal circuit. Accordingly, the likelihood of the plurality of systems of electric power conversion circuits failing at the same time is reduced.

Here, when all systems are normally operating, the particular circuit and the normal circuit are required to have the same output characteristics. Therefore, the idea of the present disclosure is not to set the switching elements forming the particular circuit and the normal circuit to have greatly differing electrical characteristics. Instead, ultimately, only the heat dissipation properties differ. In other words, in the present disclosure, based on the idea that a longer lifespan may be ensured by just suppressing a temperature rise of a switching element when energized, the "particular circuit" and the "normal circuit" are differentiated.

Further, realistically, even if, as in a conventional controller, all systems use components from the same maker, having the same part number, and from the same lot, there are variations in cumulative component tolerances, wire resistances due to soldering and the like, and so on. Accordingly, the likelihood of such plurality of systems failing at the same time is not that high.

However, taking a statistical approach, it is contemplated that if a conventional controller has a probability of P for the plurality of systems to fail at the same time, then the controller of the present disclosure has a probability of Q for the plurality of systems to fail at the same time, where Q is smaller than P. In short, the present disclosure exhibits an effect of "reducing the likelihood" of the plurality of systems of electric power conversion circuits failing at the same time.

According to the present disclosure, as examples of differentiating the "particular circuit" and the "normal circuit", four examples (1) to (4) are given below. These examples may be combined with each other.

(1) Components having different heat dissipation properties are used for the switching elements. Components having superior heat dissipation properties are used for the switching elements of the particular circuit as compared to the switching elements of the normal circuit. For example, components from different makers, components from different lots, components having different packaging, and the like may be used.

Examples (2) and (3) below assume a so-called "rear surface heat dissipation" configuration. In other words, the plurality of switching elements include a rear surface heat dissipation portion on a surface on a surface of the plurality of switching elements that faces away from a substrate, where the plurality of switching elements are mounted on the substrate. The heat sink includes a heat reception surface that faces the rear surface heat dissipation portion. Further, an insulating heat dissipation layer is provided between the rear surface heat dissipation portion and the heat reception surface, the insulating heat dissipation layer ensuring insulation and conducting heat from the switching elements to the heat sink. The insulating heat dissipation layer corresponds to insulating a heat dissipation grease, an insulating heat dissipation layer, and the like.

For the rear surface heat dissipation configuration, examples (2) or (3) below are applicable.

(2) A thickness of the insulating heat dissipation layer, in other words, a heat dissipation distance through the insulating heat dissipation layer between the rear surface heat dissipation portion and the heat reception surface in the particular circuit, is different. The heat dissipation distance of the particular circuit is shorter than the heat dissipation distance of the normal circuit.

(3) Materials having different heat conductivity are used as the insulating heat dissipation layer. A material used as the insulating heat dissipation layer in the particular circuit has greater heat conductivity as compared to the insulating heat dissipation layer of the normal circuit.

(4) A thickness of a corresponding portion of the heat sink is different. A thickness of the heat sink corresponding to the particular circuit is greater than a thickness of the heat sink corresponding to the normal circuit.

As configured above, a temperature rise of the switching elements of the particular circuit may be decreased by, for example, 10° C. as compared to the switching elements of the normal circuit. In this case, based on Arrhenius' equation of halving every 10° C., the lifespan of the particular circuit may be set to twice the lifespan of the normal circuit.

BRIEF DESCRIPTION OF THE DRAWINGS

The disclosure, together with additional objectives, features and advantages thereof, will be best understood from the following description, the appended claims and the accompanying drawings, in which:

DETAILED DESCRIPTION

Figure 1:
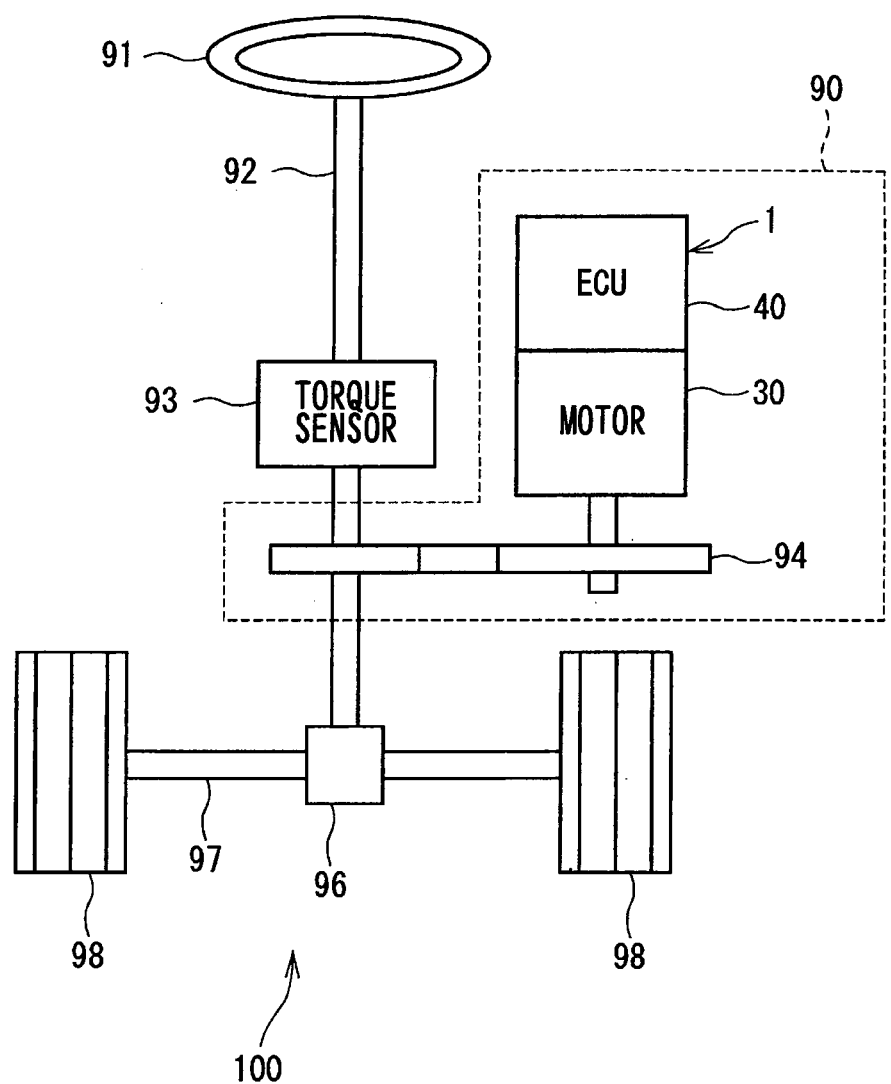
FIG. 1 is a block diagram showing the entirety of an electric power steering device in which an ECU (electrical rotating machine controller) according to each embodiment of the present disclosure is used.

Hereinafter, an electrical rotating machine controller in accordance with a plurality of embodiments of the present disclosure will be explained with reference to the figures. Configurations which are substantially the same for a plurality of embodiments are denoted with the same reference numerals, and explanations thereof are omitted for brevity.

(Common Configurations)

An ECU, which acts as an "electrical rotating machine controller", is common to each embodiment of the present disclosure, and will be explained with reference to FIGS. 1 to 5. Here, "the present embodiment" as used when explaining common configurations covers any of the first, second, third, and fourth embodiments below. This ECU controls energizing of a motor unit. The motor unit acts as an "electrical rotating machine" that generates steering assist torque in an electric power steering device of a vehicle. In particular, the ECU of the present embodiment is integrally joined with the motor unit to form a so-called "electro-mechanically integrated" drive device (or actuator).

FIG. 1 shows the configuration of the entirety of a steering system 100. The steering system 100 includes a handle 91, a column shaft 92, a pinion gear 96, a rack shaft 97, car wheels 98, and an electric power steering device 90.

A torque sensor 93 that detects steering torque is disposed on the column shaft 92, which is connected to the handle 91. The pinion gear 96, which is disposed at a distal tip of the column shaft 92, is geared with the rack shaft 97. At either end of the rack shaft 97, a pair of the car wheels 98 is provided through a tie rod or such. When a driver turns the handle 91, the column shaft 92, which is connected to the handle 91, rotates. The rotation of the column shaft 92 is converted into linear motion of the rack shaft 97 through the pinion gear 96. Then, the pair of car wheels 98 are steered with an angle based on a displacement amount of the rack shaft 97.

The electric power steering device 90 includes a drive device 1 and a reduction gear 94. In the electric power steering device 90, a motor unit 30 outputs steering assist torque based on steering torque, vehicle speed, and the like. The electric power steering device 90 transmits the steering assist torque to the column shaft 92 through the reduction gear 94.

Further, the electric power steering device 90 is not limited to a column-mounted type as shown in FIG. 1, but may also be a rack-mounted electric power steering device.

Next, the electrical configurations of the motor unit 30 and an ECU 40 included in the drive device 1 will be explained with reference to FIG. 2. A portion of control lines and the like are omitted from FIG. 2 for simplicity.

The motor unit 30 is a three-phase alternating current brushless motor, and includes a first winding set 31 and a second winding set 32 that act as "a plurality of winding sets". The first winding set 31 includes a U-phase coil 311, a V-phase coil 312, and a W-phase coil 313. The second winding set 32 includes a U-phase coil 321, a V-phase coil 322, and a W-phase coil 323.

The ECU 40 includes power source relays 51, 52, reverse protection relays 53, 54, capacitors 55, 56, a choke coil 59, switching elements 611 to 616, 621 to 626, a rotation angle sensor 65, a microprocessor 67, and an ASIC 68. A first inverter 601 and a second inverter 602, which act as a "plurality of electric power conversion circuits", are configured from the switching elements 611 to 616 and 621 to 626. In the present embodiment, the electronic components included in the ECU 40 are mounted on one substrate 41.

The power source relay 51, the reverse protection relay 53, the capacitor 55, and the first inverter 601 are disposed to correspond with the first winding set 31. These electronic components, when combined with the first winding set 31, are referred to as "a first system 501". Further, the power source relay 52, the reverse protection relay 54, the capacitor 56, and the second inverter 602 are disposed to correspond with the second winding set 32. These electronic components, when combined with the second winding set 32, are referred to as "a second system 502". In other words, the ECU 40 of the present embodiment includes two system of inverters 601, 602 that correspond to two winding sets 31, 32.

The circuit configuration of the first system 501 is the same as that of the second system 502. Accordingly, the circuit configuration of the first system 501 is explained below, and explanations of the circuit configuration of the second system 502 are omitted for brevity where appropriate.

In the first inverter 601, the six switching elements 611 to 616 are in a bridge connection and switch energizing of the first winding set 31. In the second inverter 602, the six switching elements 621 to 626 are in a bridge connection and switch energizing of the second winding set 32. The switching elements 611 to 616, 621 to 626 may be, for example, MOSFETs (metal-oxide-semiconductor field-effect-transistors). Alternatively, IGBTs (insulated-gate bipolar transistors) or equivalent elements may be used.

The switching elements 611, 612, 613 are on a high-voltage side of the first inverter 601. Further, the drains of the switching elements 611, 612, 613 are connected to a positive terminal of a battery 49 that acts as a "direct current source". The sources of the switching elements 611, 612, 613 are connected to the drains of the switching elements 614, 615, 616 which are on a low-voltage side. The sources of the low-voltage side switching elements 614, 615, 616 are connected to a negative terminal of the battery 49 through current sensing elements 571, 572, 573. The connection points between the high-voltage side switching elements 611, 612, 613 and the low-voltage side switching elements 614, 615, 616 are connected to each phase coil 311, 312, 313 of the first winding set 31. The same applies to the second inverter 602.

The current sensing elements 571, 572, 573 of the first system 501 and the current sensing elements 581, 582, 583 of the second system may be, for example, shunt resistors, and detect current flowing in each phase of each system's winding set 31, 32.

The power source relay 51 of the first system 501 is disposed between the battery 49 and the first inverter 601, and conducts or interrupts a connection between the battery 49 and the first inverter 601.

The reverse protection relay 53 is disposed between the power source relay 51 and the first inverter 601 such that a parasitic diode direction is opposite of the direction of the power source relay 51. The reverse protection relay 53 prevents reverse current from flowing to the first inverter 601 when the terminals of the battery 49 are connected in reverse, and protects the ECU 40.

The power source relay 51 and the reverse protection relay 53 may be MOSFET or IGBT semiconductor relays, in the same manner as a half bridge circuit of an inverter.

The capacitor 55 of the first system 501 and the choke coil 59 form a filter circuit at an input portion of the first inverter 601 to reduce noise transmitted from other devices sharing the battery 49, and to reduce noise transmitted from the drive device 1 to these other devices. Further, the capacitor 55 stores electrical charge, and helps provide electric power to the first inverter 601.

The same applies to the power source relay 52, the reverse protection relay 54, and the capacitor 56 of the second system 502.

The rotation angle sensor 65 includes a magnetic sensing element, and detects a rotation angle of a rotor 34 by sensing a magnetic field of a magnet 38 (see FIG. 3) disposed at a second end 352 of a shaft 35 to be described later.

A control operation unit 66 is formed from the microprocessor 67 and the ASIC 68 which is an integrated circuit component. The microprocessor 67 calculates instruction values related to energizing of the first winding set 31 and the second winding set 32 based on signals from the torque sensor 93, the rotation angle sensor 65, and the like.

The ASIC 68 includes a pre-driver, a signal amplifier, and a regulator. The pre-driver generates a drive signal based on an instruction value, and outputs the generated drive signal to the first inverter 601 and the second inverter 602. The signal amplifier amplifies signals detected by the current sensing elements 571 to 573, 581 to 583, the rotation angle sensor 65, and the like, and outputs the amplified signals to the microprocessor 67. The regulator stabilizes voltages supplied to the microprocessor 67 and the like.

Next, the configuration of the drive device 1 will be explained with reference to FIGS. 3 to 5. Where appropriate, a central axis O direction of the motor unit 30 will be referred to as an "axial direction", and a radial direction of the motor unit 30 will be referred to as a "radial direction".

Figure 3:
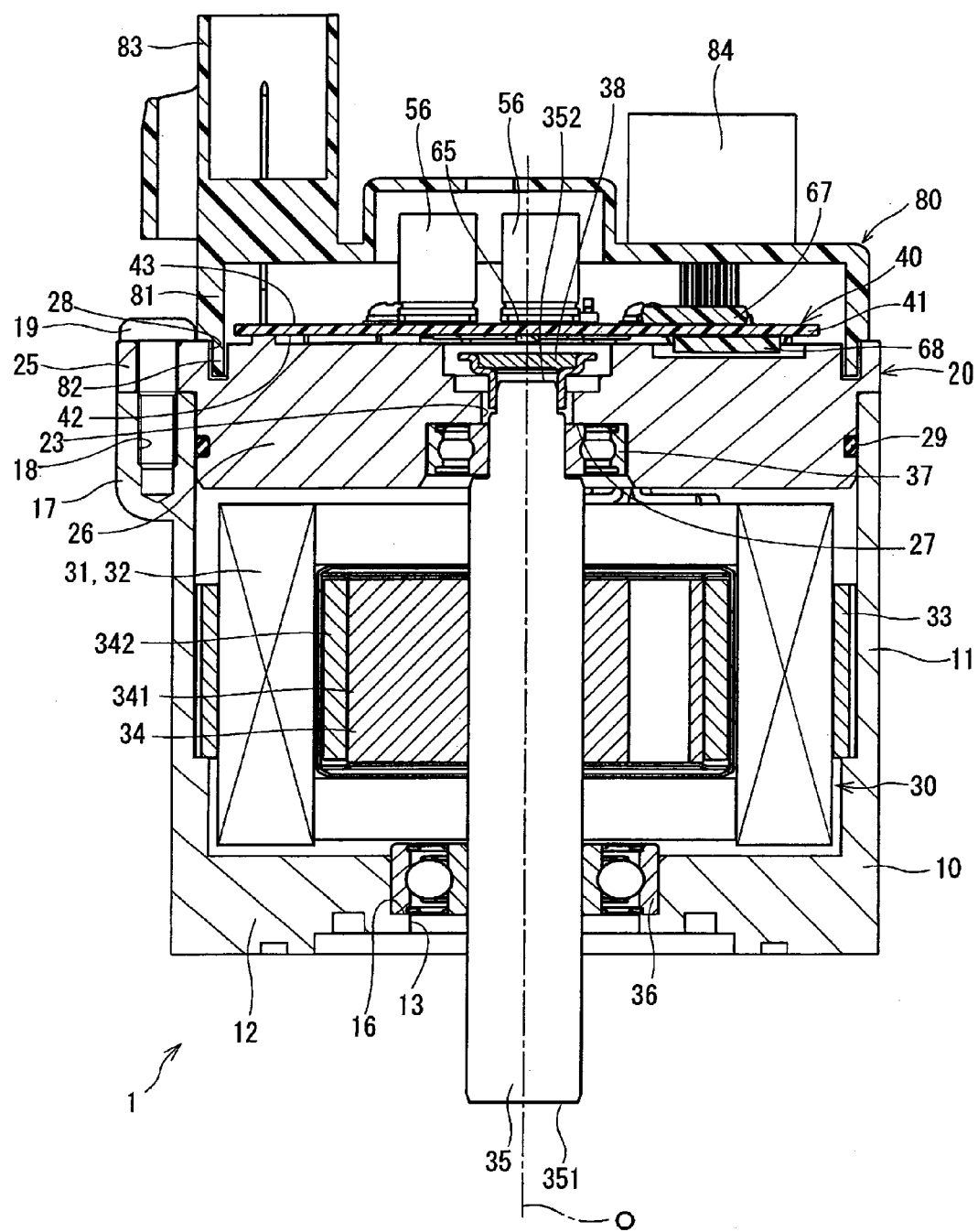
FIG. 3 is a cross-sectional view showing a drive device equipped with the ECU of each embodiment of the present disclosure.

As shown in FIG. 3, the drive device 1 includes a motor case 10, a heat sink 20, the motor unit 30, the ECU 40, and a controller cover 80.

The motor case 10 is formed from a metal such as aluminum and the like, and is integrally formed from a cylinder portion 11 and a bottom portion 12 to have a cup shape. The motor unit 30 is housing inside the cylinder potion 11. In the motor case 10 of the present embodiment, the bottom portion 12 is disposed at a side opposite from the ECU 40, and an opening side is where the ECU 40 is disposed. The bottom portion 12 includes, at a center thereof, a shaft hole 13 through which a first end 351 of the shaft 35 is inserted, and a recessed portion 16 which houses a first bearing 36. The first end 351 of the shaft 35 is rotatably supported in the first bearing 36 which is housed within the recessed portion 16.

A fixing portion 17 is formed to protrude outward in the radial direction at the opening side of the cylinder portion 11. The fixing portion 17 is for fixing a flange portion 25 of the heat sink 20. A screw hole 18 is formed in the fixing portion 17.

The heat sink 20 is formed from a metal having good heat conduction properties such as aluminum. The heat sink 20 is shaped as a stepped plate and includes the flange portion 25 and a fitting portion 26. Further, the heat sink 20 faces a first surface 42 of a substrate 41 as will be described later, and receives heat generated from energizing the switching elements 611 to 616, 621 to 626.

The flange portion 25 abuts an end face of the fixing portion 17 of the motor case 10. Here, the heat sink 20 is fastened to the motor case 10 by a fixing screw 19 screwed with the screw hole 18.

The fitting portion 26 is fit with an inner wall of the cylinder portion 11 of the motor case 10. At that time, an O-ring 29 is disposed on the outer circumferential wall of the fitting portion 26. The O-ring 29 prevents water droplets and such from entering between the motor case 10 and the heat sink 20.

The center of the heat sink 20 includes a shaft hole 23 through which the second end 352 of the shaft 35 is inserted, and a recessed portion 27 in which a second bearing 37 is housed. The second end 352 of the shaft 35 is rotatably supported in the second bearing 37 which is housed within the recessed portion 27.

An adhesive groove 28 is formed at the peripheral of an end face of the heat sink 20 toward the ECU 40. Adhesive for joining with the controller cover 80 is filled in the adhesive groove 28.

The motor unit 30 includes a stator 33 around which the first and second winding sets 31, 32 are wound, a rotor 34, and the shaft 35. The motor unit 30 is housed in the motor case 10.

The stator 33 is substantially annular shaped and is formed from, e.g., laminated steel sheets and the like. Further, the stator 33 is fixed to the inside of the cylinder portion 11. When alternating current is applied to the first and second winding sets 31, 32, a rotating magnetic field is generated in the stator 33.

The rotor 34 includes a rotor core 341 and a permanent magnet 342. The rotor core 341 is substantially cylindrical shaped and is formed from a magnetic material such as iron and the like. Further, the rotor core 341 is disposed to be coaxial with the stator 33. The permanent magnet 342 is disposed radially outward of the rotor core 341 such that N poles and S poles alternate.

The shaft 35 is rod-shaped and is formed from, e.g., metal. The shaft 35 is fixed to the axial center of the rotor core 341. Further, the shaft 35 is rotatably supported in the first bearing 36 and the second bearing 37, and integrally rotates with the rotor 34.

The first end 351 of the shaft 35 is inserted through the shaft hole 13 formed in the bottom portion 12 of the motor case 10, and protrudes out of the motor case 10. An output end formed at the first end 351, not illustrated, is connected to the reduction gear 94 (see FIG. 1). The magnet 38, which is for the rotation angle sensor 65 to detect the rotation angle, is retained at the second end 352 of the shaft 35.

Figure 4A:
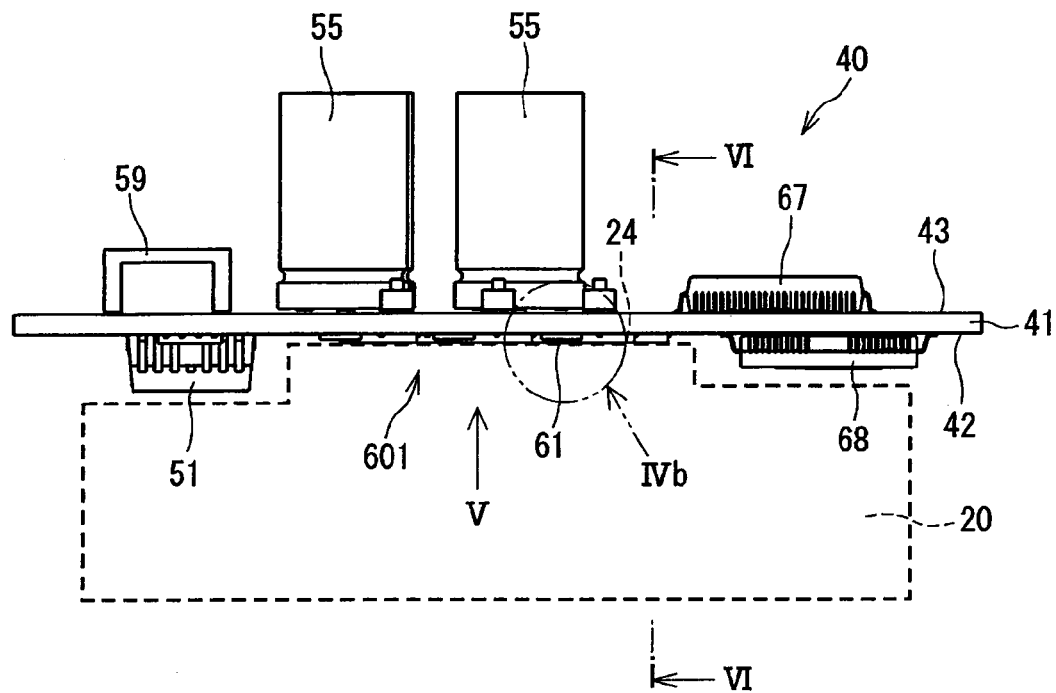
FIG. 4A is a side view of the ECU in the drive device of FIG. 3.
Figure 4B:
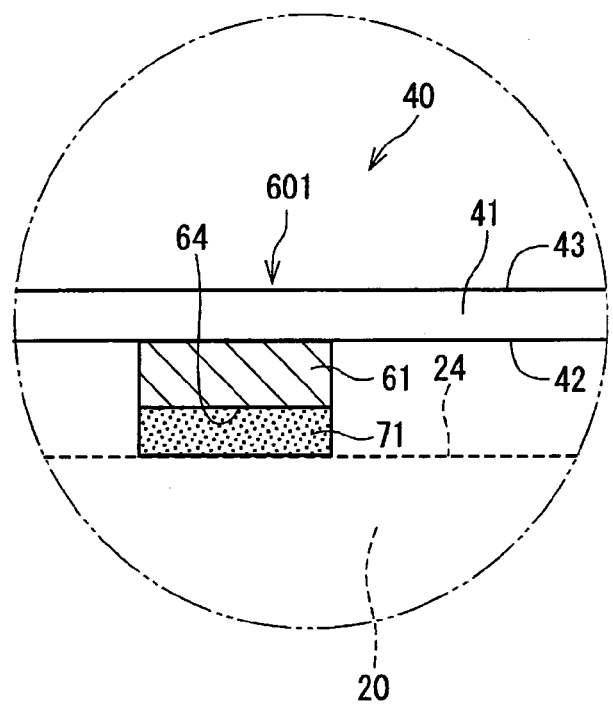
FIG. 4B is an enlarged view of the IVb region of FIG. 4A.
Figure 5:
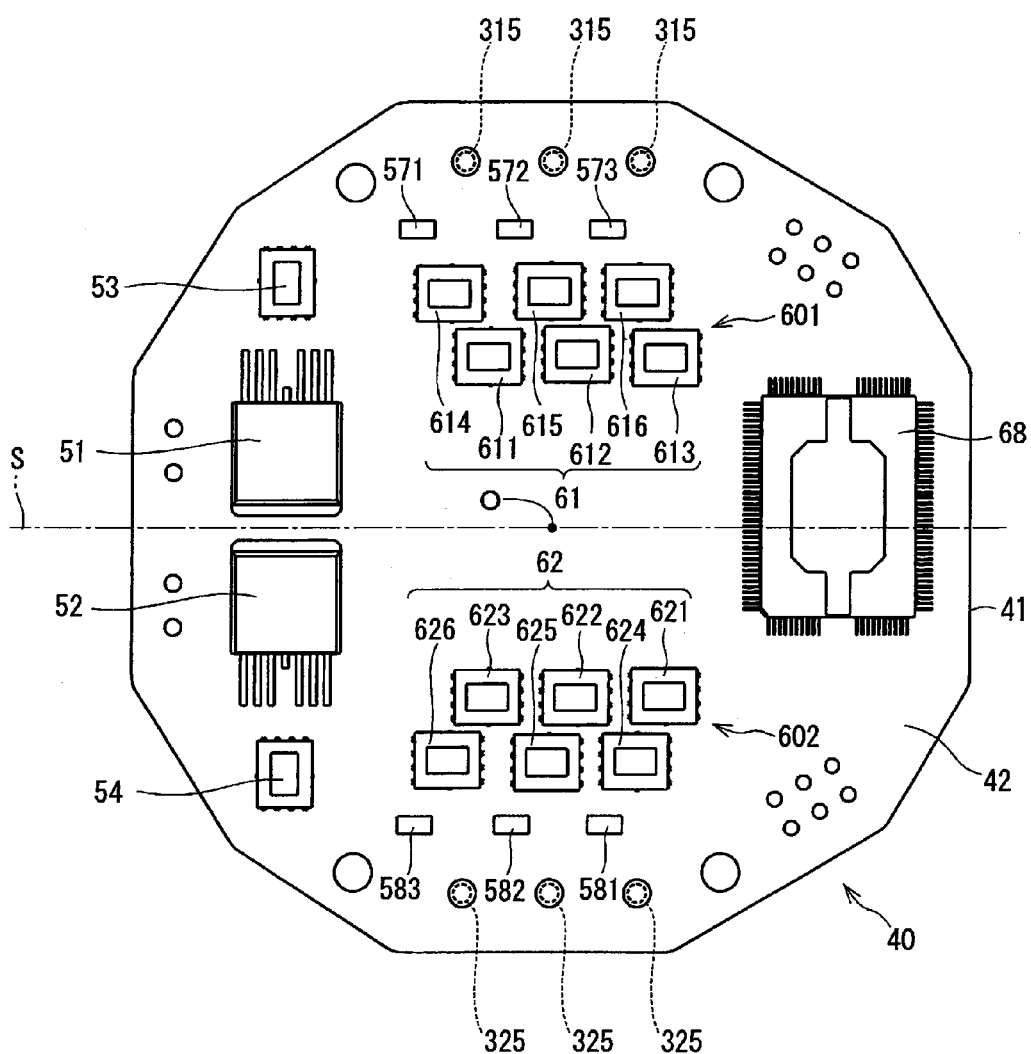
FIG. 5 is a directional view in the V direction of FIG. 4A.

As shown in FIGS. 3 to 5, the ECU 40 is housed within the controller cover 80 at one side of the heat sink 20 opposite from the motor unit 30, where various electronic components are mounted on the substrate 41. Hereinafter, the surface of the substrate 41 that faces the heat sink 20 is referred to as a first surface 42, and the surface of the substrate that faces away from the heat sink 20 is referred to as a second surface 43.

As shown in FIGS. 4 and 5, the switching elements 611 to 616, 621 to 626, the current sensing elements 571, 572, 573, 581, 582, 583, the power source relays 51, 52, the reverse protection relays 53, 54, and the ASIC 68 are mounted on the first surface 42 of the substrate 41. Relatively large electronic components, including the capacitors 55, 56, the choke coil 59, and the microprocessor 67, are mounted on the second surface 43 of the substrate 41.

Further, a plurality of throughholes are formed radially outward of the regions where the above described electronic components are mounted. Motor wires 315 extending from each phase coil 311, 312, 313 of the first winding set 31, and motor wires 325 extending from each phase coil 321, 322, 323 of the second winding set 32, are inserted through these throughholes.

Regarding positioning of electronic components on the first surface 42, the switching elements 611 to 616 (hereinafter, collectively denoted with a reference numeral of "61") of the first inverter 601 and the switching elements 621 to 626 (hereinafter, collectively denoted with a reference numeral of "62") of the second inverter 602 are respectively grouped together.

An axis of symmetry S passes through the central axis O. Here, the placement region of the switching elements 61 of the first inverter 601, and the placement region of the switching elements 62 of the second inverter 602, are symmetrical with each other about the axis of symmetry S. Further, the power source relay 51 and the reverse protection relay 53 of the first system 501, and the power source relay 52 and the reverse protection relay 54 of the second system 502, are also positioned symmetrical with each other about the axis of symmetry S.

As shown in FIGS. 4A and 4B, the switching elements 61, which are included in the first inverter 601 and mounted on the first surface 42, have a "rear surface" that faces away from the substrate 41 and face toward a heat reception surface 24 of the heat sink 20. In the present embodiment, when the switching elements 61 are energized and generate heat, this heat is not dissipated to the heat sink 20 through the relay portions mounted on the substrate 41 and then through the substrate 41. Instead, this heat is dissipated directly from the rear surface to the heat reception surface 24 of the heat sink 20. Accordingly, the portions of the rear surface of the switching elements 61 that form heat dissipation paths are referred to as a "rear surface heat dissipation portion 64".

As shown in FIG. 4B, an insulating heat dissipation layer 71 is disposed between the rear surface heat dissipation portion 64 of the switching elements 61 and the heat reception surface 24 of the heat sink 20. The insulating heat dissipation layer 71 may be a gel member that is mainly silicone with heat conductive filler, a compressed sheet member, or the like. When the switching elements 61 are energized and generate heat, this heat is conducted from the rear surface heat dissipation portion 64 to the heat reception surface 24 of the heat sink 20 through the insulating heat dissipation layer 71. As a result, the switching elements 61 may be prevented from failing due to overheating.

The above configuration in accordance with the switching elements 61 of the first inverter 601 is the same as that of the switching elements 62 of the second inverter 602.

The controller cover 80 covers one side of the ECU 40 away from the motor case 10. The controller cover 80 includes a peripheral wall 81, and a protrusion 82 formed at a tip portion of the peripheral wall 81. Further, the protrusion 82 is inserted into the adhesive groove 28 of the heat sink 20, and is fixed to the adhesive groove 28 by adhesive. Accordingly, water droplets and such are prevented from entering between the heat sink 20 and the controller cover 80, and the controller cover 80 is joined to the heat sink 20.

A power supply connector 83 and a signal connector 84 are integrally formed on an end face of the controller cover 80 facing away from the motor case 10. Electric power from the battery 49 is supplied to the power supply connector 83, and external signals such as CAN signals or torque signals are input to the signal connector 84.

As explained above, the ECU 40 of the present embodiment includes two systems of inverters 601, 602, and drives the motor unit 30 by controlling energizing of two winding sets 31, 32. In other words, the two systems of inverters 601, 602 convert and output electric power from the battery 49 according to a switching operation of the switching elements 61, 62. Suppose that the switching elements 61, 62 of one of the systems were to experience short circuit failure or open circuit failure. In this case, the inverter of the failed system would stop operating, and the motor unit 30 may be continue to be driven by only the inverter of the normally-operating system. For example, in the case of the electric power steering device 90, steering assist torque may be output even if one system fails.

In other words, the two systems of inverters 601, 602 prevent total interruption of torque output when one system fails, and are configured in a redundant manner to ensure reliability from a failsafe point of view.

Incidentally, the electrical properties of the various electronic components in the inverters 601, 602, including the switching elements 61, 62, are set to be substantially the same for both systems. However, if the characteristics of the switching elements 61, 62, which generate the most heat among the electronic components of the two systems, are strictly the same, degradation due to heat generation advances at the same rate. As a result, it is possible that the electronic components reach end-of-life all at once, and thus the two systems fail at the same time. If, for example, such a situation occurs, one goal of redundant design, which is "when one system fails, allow operation to continue with other systems", is not achieved.

Accordingly, one object of the ECU (electrical rotating machine controller) of the present disclosure is to, under the premise of having multiple systems of inverters (electric power conversion circuits), reduce the likelihood of multiple systems failing at the same time.

For this reason, of the multiple systems of inverters included in the ECU, a particular inverter (i.e., a particular electric power conversion circuit) is a "particular circuit", and is differentiated from an other inverter (i.e., an other electric power conversion circuit) which is a "normal circuit". Further, compared to the normal circuit, the heat dissipation configuration from the switching elements of the particular circuit to the heat sink is intentionally partially different such that under the same energizing conditions, the temperature rise of the switching elements of the particular circuit is suppressed.

In the present embodiment, with an object of reducing the likelihood of both systems of inverters 601, 602, which are an example of "multiple systems", failing at the same time, the configurations of the two systems are partially different.

Hereinafter, the ECU 40 of the first, second, third, and fourth embodiments are denoted with reference numerals of 401 to 404, and the specific aspects of heat dissipation configurations which are partially different will be explained in order for each embodiment. Here, in each of the first, second, third, and fourth embodiments, the first inverter 601 is an example of a "normal circuit", and the second inverter 602 is an example of a "particular circuit".

Further, in the ECU 401 to 404 of each embodiment, as explained with reference to FIGS. 3 to 5, the two systems of inverters 601, 602 are positioned on one substrate 41 and are symmetrical with each other about the axis of symmetry S.

In addition, the "rear surface heat dissipation" configuration is used, where heat generated by the switching elements 61, 62 is dissipated from the rear surface heat dissipation portion 64, through the insulating heat dissipation layer 71, and to the heat reception surface 24 of the heat sink 20.

First Embodiment

Figure 6:
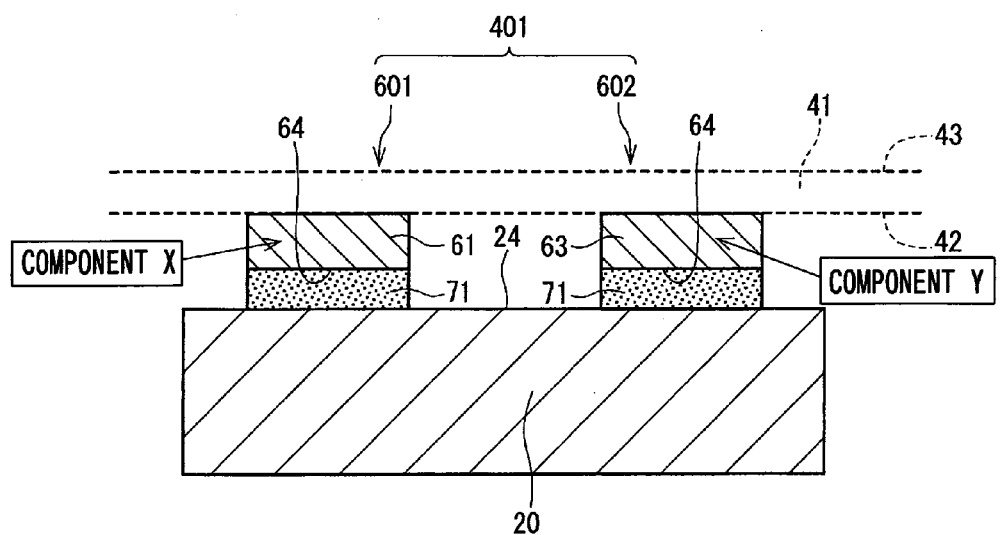
FIG. 6 is an enlarged cross-sectional and schematic view showing an ECU according to a first embodiment of the present disclosure.

A first embodiment of the present disclosure will be explained with reference to FIG. 6. Here, FIG. 6 is based on a cross-sectional view along VI-VI of FIG. 4A, where the first inverter 601 is shown on the left side of FIG. 6, and the second inverter 602 is shown on the right side of FIG. 6. The first inverter 601 acts as a "normal circuit" and includes the six switching elements 611 to 616, and of these, one representative "switching element 61" is illustrated. Here, in a conventional configuration, the second inverter 602 would include the six switching elements 621 to 626, and of these, one representative "switching element 62" having the same characteristics as the switching element 61 would be illustrated.

However, as actually illustrated in FIG. 6, in an ECU 401 of the first embodiment, the two systems of inverters 601, 602 use components with different heat dissipation properties as the switching elements. For example, the first inverter 601, which is a "normal circuit", uses "component X" as the switching element 61. Then the second inverter 602, which is a "particular circuit", uses "component Y" which has superior heat dissipation properties as a switching element 63, different from the switching element 61.

The component X and the component Y may be, for example, equivalent components from different makers, components with the same part number but from different manufacturing lots, components with different packaging, and the like. For example, assuming that chips of the switching elements have the same electrical properties and, when energized, generate the same amount of heat. Even in such a case, if, for example, the packaging covering the chips (the resin mold portions) have different heat conductivity, the efficiency in which heat dissipates from inside the chip to the surface of the packaging may be different. For components from different makers, or the same components from different manufacturing lots, the same kind of difference may be exhibited.

Accordingly, the "component Y" is selected as a component with superior heat dissipation properties inside the switching element, and the "component X" is selected as a component with inferior heat dissipation properties inside the switching element. As a result, the switching element 63 (component Y) of the second inverter 602 is more likely to have a longer lifespan than the switching element 61 (component X) of the first inverter 601. Accordingly, the likelihood of both systems failing at the same time is reduced. In the electric power steering device 90, total interruption of steering assist torque output may be prevented, and reliability may be ensured from a failsafe point of view.

Moreover, in the inverters 601, 602, aside from the switching elements 61, 63 that form the half-bridge circuit, the semiconductor relays forming the power source relays 51, 52 and the reverse protection relays 53, 54 may also be made to differ in heat dissipation configurations between the two systems.

Of course, in the ECU 401 of the first embodiment, when the two systems are operating normally, the first inverter 601 and the second inverter 602 are required to control the first winding set 31 and the second winding set 32 by outputting the same amount of electric power. In other words, the particular circuit and the normal circuit, when under the same energizing conditions, output, as much as possible, the same amount of electric power. Accordingly, the intention of using "different components" in the first embodiment does not assume going as far as, for example, using components that differ in fundamental operating principles or components that greatly differ in fundamental specification ratings. Ultimately, functions should be the same during normal operation, and only the heat dissipation properties of the switching elements are intended to differ.

Further, realistically, even if the two systems use components from the same maker, having the same part number, and from the same lot, and the switching elements are configured to have the same heat dissipation properties, there are variations in cumulative component tolerances, wire resistances due to soldering and the like, and so on. Accordingly, the likelihood of such two systems of inverters 601, 602 failing at the same time is not that high.

However, taking a statistical approach, it is contemplated that if a conventional ECU has a probability of P for the two systems to fail at the same time, then the ECU 401 of the first embodiment has a probability of Q for the two systems to fail at the same time, where Q is smaller than P. Accordingly, the first embodiment exhibits an effect of "reducing the likelihood" of the two systems of inverters 601, 602 failing at the same time.

Next, the ECU of the second, third, and fourth embodiments of the present disclosure will be explained in order. In each of the embodiments, the two systems have the same configurations, aside from the heat dissipation configuration which is referred to as "a difference between the two systems". Further, in each of the second, third, and fourth embodiments, "the switching element 61 of the first inverter 601" and "the switching element 62 of the second inverter 602" are the same component.

Second Embodiment

An ECU of the second embodiment of the present disclosure will be explained with reference to FIGS. 7 and 8.

Figure 7:
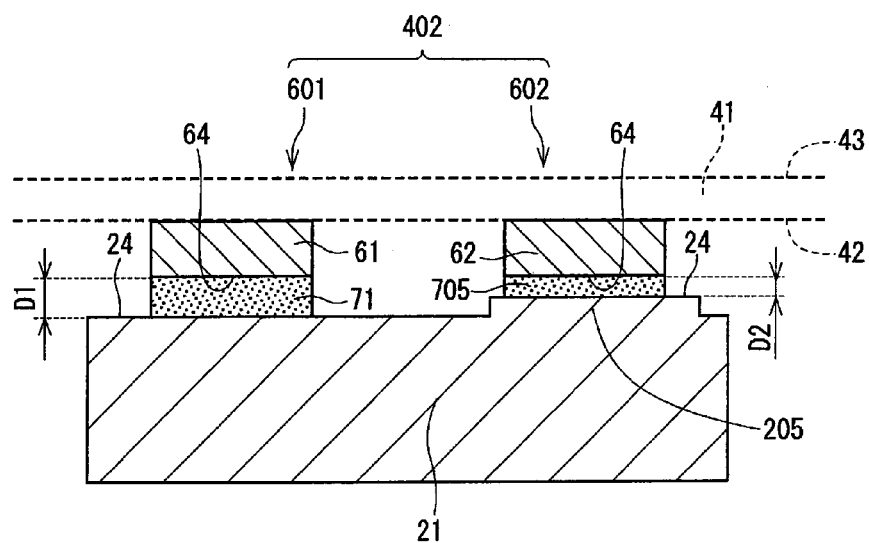
FIG. 7 is an enlarged cross-sectional and schematic view showing an ECU according to a second embodiment of the present disclosure.

As shown in FIG. 7, in the ECU 402 of the second embodiment, between the two systems of inverters 601, 602, the thickness of the insulating heat dissipation layers 71, 705, or in other words, a heat dissipation distance through the insulating heat dissipation layers 71, 705 between the rear surface heat dissipation portion 64 and the heat reception surface 24, is different.

For example, in the first inverter 601, the insulating heat dissipation layer 71 is set with a thickness D1 of 1.0 mm, and in the second inverter 602, the insulating heat dissipation layer 705 is set with a thickness D2 of 0.5 mm. This configuration may be implemented by setting the height and thickness of the substrate 41 to be constant, and disposing a step portion 205 at a portion of the heat sink 21 facing the second inverter 602.

Figure 8:
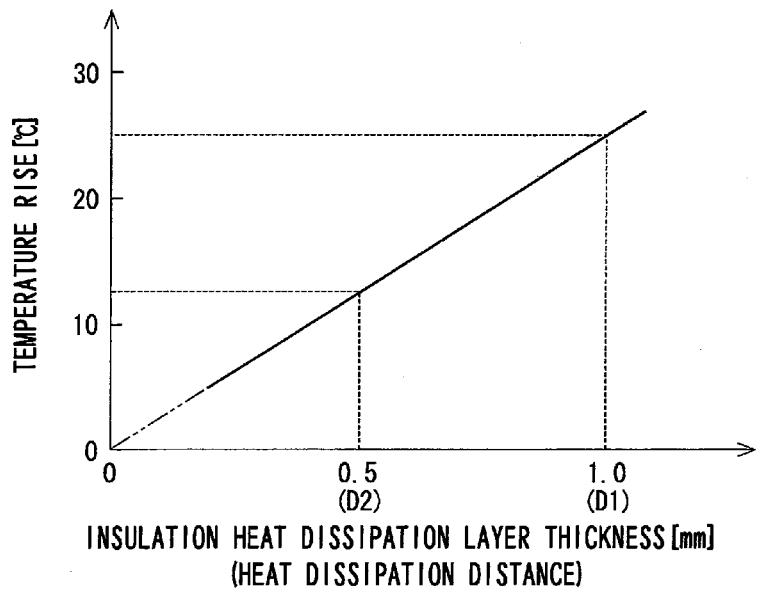
FIG. 8 is a characteristics chart showing a relationship between a thickness of an insulating heat dissipation layer (a heat dissipation distance) and a temperature rise of a switching element.

As shown in FIG. 8, a proportional relationship exists between the thickness of the insulating heat dissipation layers 71, 705 (or heat dissipation distance) and a temperature rise of the switching elements 61, 62. In reality, in order to maintain insulation, the thickness cannot reach 0, but at a hypothetical thickness limit of 0 mm, 100% of the heat generated by the switching elements 61, 62 is dissipated, and thus the temperature rise is assumed to be 0° C. Assuming that degradation in the switching elements 61, 62 is caused by chemical reactions causing degradation over time, Arrhenius' equation of halving every 10° C., or in other words, "if temperature rises by 10° C., lifespan reduces by half", may be applied as a rule. If the temperature of the switching elements rise by 25° C. at a thickness of 1.0 mm for the insulating heat dissipation layer, and then the thickness of the insulating heat dissipation layer is reduced by 0.5 mm, a difference of 12.5° C. is seen. From this, a lifespan of $2^{1.25}$ or approximately 2.4 times may be expected to be maintained.

Third Embodiment

An ECU of the third embodiment of the present disclosure will be explained with reference to FIG. 9.

Figure 9:
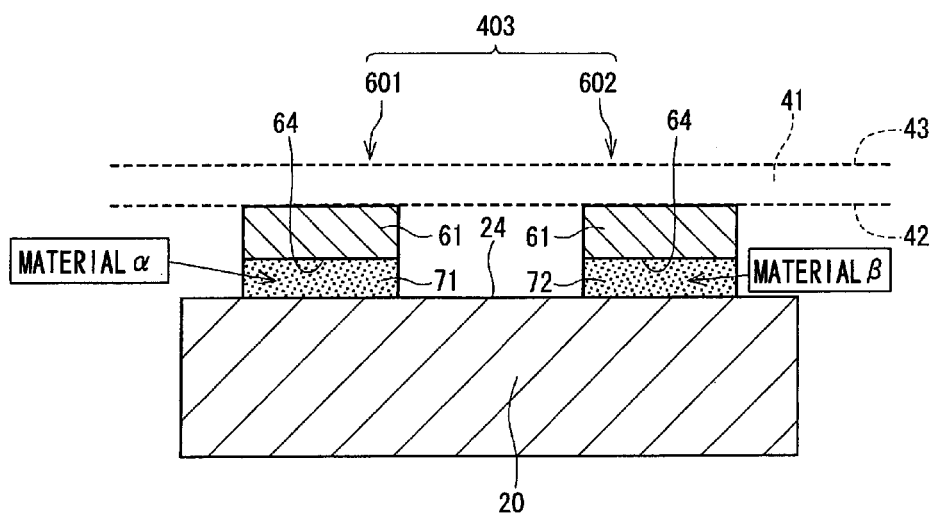
FIG. 9 is an enlarged cross-sectional and schematic view showing an ECU according to a third embodiment of the present disclosure.

As shown in FIG. 9, in the ECU 403 of the third embodiment, between the two systems of inverters 601, 602, materials having different heat conductivities are used as the insulating heat dissipation layers 71, 72.

For example, a "material a" is used as the insulating heat dissipation layer 71 of the first inverter 601, and a "material 13" is used as the insulating heat dissipation layer 72 of the second inverter 602. Specifically, by using things with different amounts of heat conductive filler, or things having different heat conductive filler material (aluminum oxide, aluminum nitride, and so on), or the like, the heat conductivity of the insulating heat dissipation layer 72 of the second system is set to be larger than the heat conductivity of the insulating heat dissipation layer 71 of the first system. As a result, the switching element 62 of the second inverter 602 is more likely to have a longer lifespan than the switching element 61 of the first inverter 601.

Fourth Embodiment

An ECU of the fourth embodiment of the present disclosure will be explained with reference to FIGS. 10 and 11.

Figure 10:
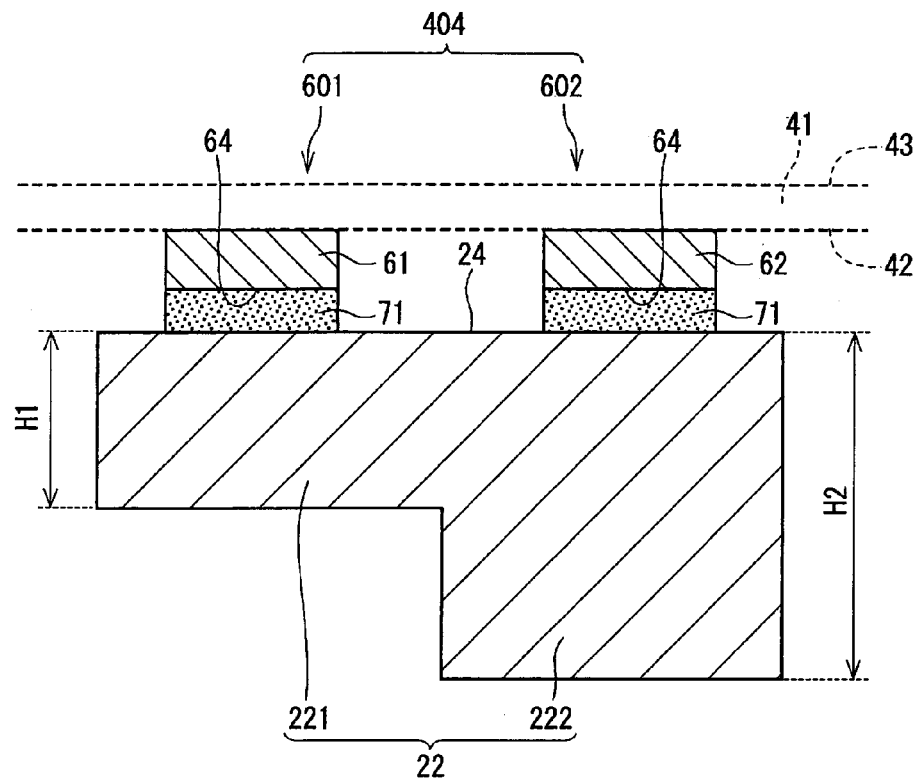
FIG. 10 is an enlarged cross-sectional and schematic view showing an ECU according to a fourth embodiment of the present disclosure.

As shown in FIG. 10, in the ECU 404 of the fourth embodiment, between the two systems of inverters 601, 602, the thicknesses of the corresponding portions of the heat sink 22 are different.

For example, a first portion 221 of the heat sink 22 corresponding to the first inverter 601 is set with a thickness H1 of 4 mm, and a second portion 222 of the heat sink 22 corresponding to the second inverter 602 is set with a thickness H2 of 8 mm.

Figure 11:
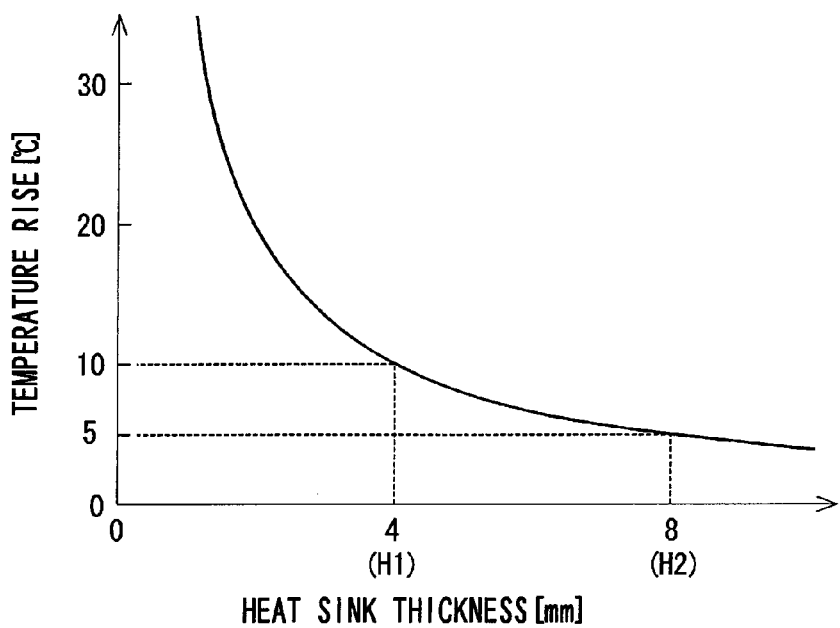
FIG. 11 is a characteristics chart showing a relationship between a thickness of a heat sink and a temperature rise of a switching element.

As shown in FIG. 11, an inverse proportional relationship exists between the thickness of the heat sink 22 and the temperature rise of the switching elements 61, 62.

Similar to the second embodiment, assuming that degradation in the switching elements 61, 62 is caused by chemical reactions causing degradation over time, Arrhenius' equation of halving every 10° C., or in other words, "if temperature rises by 10° C., lifespan reduces by half", may be applied as a rule.

If temperature rise is 10° C. when the thickness of the heat sink is 4 mm, and temperature rise is 5° C. when the thickness of the heat sink is 8 mm, by changing the thickness of the heat sink from 4 mm to 8 mm, a difference of 5° C. is seen. From this, a lifespan of $2^{0.5}$ or approximately 1.4 times may be expected to be maintained.

Each of the above described second, third, and fourth embodiments is configured such that the temperature rise of the second inverter 602, which acts as a "particular circuit", is suppressed compared to the first inverter 601, which acts as a "normal circuit". Accordingly, similar to the first embodiment, the second inverter 602 is more likely to have a longer lifespan than the first inverter 601. Accordingly, the likelihood of the two systems failing at the same time may be reduced.

Moreover, the above described first, second, third, and fourth embodiments may be combined with each other. As a result of such a combination, the heat dissipation configurations of the normal circuit and the particular circuit may be more clearly differentiated.

Other Embodiments

In the above described embodiments, the two systems of inverters 601, 602 act as a "plurality of systems". However, the present disclosure is also applicable to an ECU (electrical rotating machine controller) having three or more systems of electric power conversion circuits. In that case, the plurality of systems may be separates into a group of at least one "particular circuit" and a group of at least one "normal circuit". Further, the "particular circuits" may be further classified into a plurality of groups by levels of heat dissipation properties, and set so as to have stepwise lifespans.

In the above described embodiments, the drive device is exemplified as being integrally formed from the motor unit and the ECU (electrical rotating machine controller). However, the present disclosure may also be applied to an ECU formed separately from, and connected by a harness to, a motor unit (electrical rotating machine).

The electrical rotating machine controller of the present disclosure controls an electrical rotating machine as a target. This target is not limited to a permanent magnet type three-phase AC synchronous motor, and includes multiphase motors having four or more phases, DC brushless motors, inductance motors, and the like. Further, the target is not limited to a motor that outputs torque when energized (electric motor), but may include a power generator that generates power when receiving torque. For example in the case of a DC motor, an H-bridge circuit corresponds to the "electric power conversion circuits".

In the above described embodiments, the two systems of inverters 601, 602 are positioned on one substrate 41 and are symmetrical with each other about the axis of symmetry S. However, a separate substrate may be provided for each system, and the inverter of each system may be positioned so as to be asymmetric.

The "using components with different heat dissipation properties as switching elements" embodiment corresponding to the above described first embodiment, as well as the "corresponding portions of the heat sink have different thicknesses" embodiment corresponding to the above described fourth embodiment, are not limited to configurations with rear surface heat dissipation. Instead, these embodiments may be applied to configurations where heat is only dissipated to the heat sink through the substrate on which the switching elements are mounted.

In the above described first embodiment where different components are used for the switching elements, the switching elements are not limited to the switching elements that form the half bridge circuits as described above, but also include semiconductor relays such as the power source and reverse protection relays 51 to 54. While not illustrated in the circuit diagram of FIG. 2, for example in a configuration where semiconductor motor relays are disposed between the inverter circuit and the motor unit, components that differ for each system may be use for those semiconductor motor relays.

Figure 2:
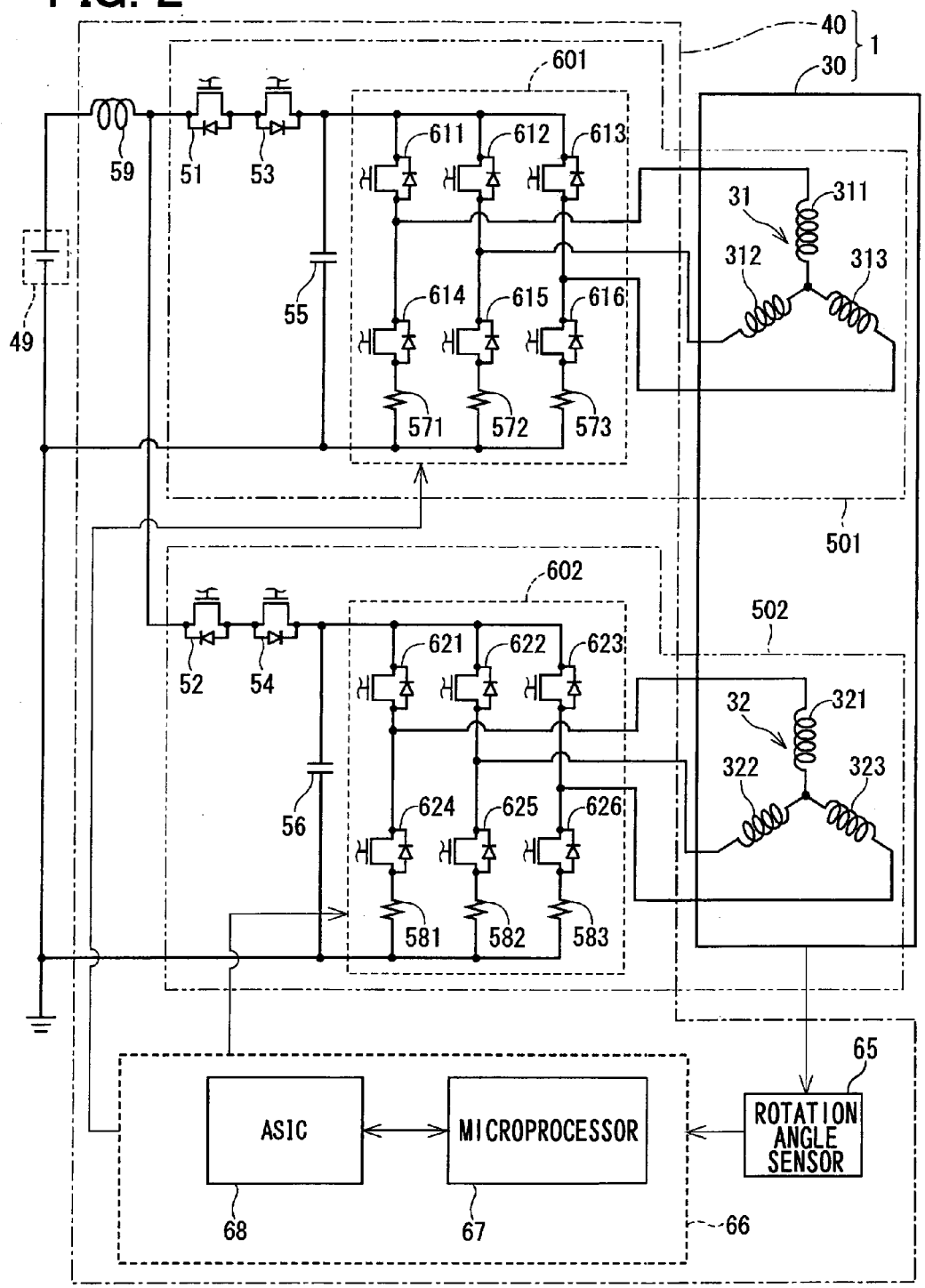
FIG. 2 is a schematic view showing a circuit of the ECU of each embodiment of the present disclosure.

The electrical rotating machine controller of the present disclosure is not limited to a column-mounted type as shown in FIG. 2, but may be applied to a rack-mounted type electric power steering device. Further, the electrical rotating machine controller may be applied to vehicle-mounted devices other than the electric power steering device, or may be applied to various types of devices other than vehicle-mounted devices.

The present disclosure is not limited to the above described embodiments. Rather, a variety of embodiments are contemplated without departing from the gist of the present disclosure.

The invention claimed is:

1. An electrical rotating machine controller for controlling energizing of an electrical rotating machine having a plurality of winding sets, comprising:
   a plurality of systems of electric power conversion circuits corresponding to the plurality of winding sets, the plurality of systems of electric power conversion circuits converting and outputting electric power from a direct current source according to a switching operation of a plurality of switching elements in a bridge connection; and
   a heat sink configured to receive heat generated by energizing of the plurality of switching elements, wherein
   a particular electric power conversion circuit of the plurality of systems of electric power conversion circuits is a particular circuit,
   an other electric power conversion circuit of the plurality of systems of electric power conversion circuits is a normal circuit,
   a heat dissipation configuration from the plurality of switching elements to the heat sink of the particular circuit is different as compared to the normal circuit, such that when the particular circuit and the normal circuit are under a same energizing condition, a temperature rise of the plurality of switching elements of the particular circuit is suppressed as compared to the normal circuit, and
   the particular circuit and the normal circuit, when under the same energizing condition, output a same amount of electric power.

2. The electrical rotating machine controller of claim 1, wherein
   components used as the plurality of switching elements have a different heat dissipation property in the particular circuit as compared to the normal circuit.

3. An electrical rotating machine controller for controlling energizing of an electrical rotating machine having a plurality of winding sets, comprising:
   a plurality of systems of electric power conversion circuits corresponding to the plurality of winding sets, the plurality of systems of electric power conversion circuits converting and outputting electric power from a direct current source according to a switching operation of a plurality of switching elements in a bridge connection;
   a heat sink configured to receive heat generated by energizing of the plurality of switching elements; and
   an insulating heat dissipation layer, wherein
   a particular electric power conversion circuit of the plurality of systems of electric power conversion circuits is a particular circuit,
   an other electric power conversion circuit of the plurality of systems of electric power conversion circuits is a normal circuit,
   a heat dissipation configuration from the plurality of switching elements to the heat sink of the particular circuit is different as compared to the normal circuit, such that when the particular circuit and the normal circuit are under a same energizing condition, a temperature rise of the plurality of switching elements of the particular circuit is suppressed as compared to the normal circuit, the particular circuit and the normal circuit, when under the same energizing condition, output a same amount of electric power, the plurality of switching elements include a rear surface heat dissipation portion on a surface of the plurality of switching elements that faces away from a substrate, the plurality of switching elements being mounted on the substrate, the heat sink includes a heat reception surface that faces the rear surface heat dissipation portion, the insulating heat dissipation layer is disposed between the rear surface heat dissipation portion and the heat reception surface, and the insulating heat dissipation layer is configured to maintain insulation and to conduct heat from the plurality of switching elements to the heat sink.

4. The electrical rotating machine controller of claim 3, wherein a heat dissipation distance through the insulating heat dissipation layer between the rear surface heat dissipation portion and the heat reception surface in the particular circuit is different as compared to the normal circuit.

5. The electrical rotating machine controller of claim 3, wherein a material used as the insulating heat dissipation layer in the particular circuit has a different heat conductivity as compared to the normal circuit.

6. The electrical rotating machine controller of claim 1, wherein, a thickness of a portion of the heat sink corresponding to the particular circuit is different as compared to the normal circuit.

7. The electrical rotating machine controller of claim 3, wherein components used as the plurality of switching elements have a different heat dissipation property in the particular circuit as compared to the normal circuit.

* * * * *